United States Patent
Lehmann et al.

(10) Patent No.: US 6,882,202 B2
(45) Date of Patent: Apr. 19, 2005

(54) MULTIPLE TRIP POINT FUSE LATCH DEVICE AND METHOD

(75) Inventors: Gunther Lehmann, Munich (DE); Norman Robson, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/347,727

(22) Filed: Jan. 21, 2003

(65) Prior Publication Data

US 2004/0140835 A1 Jul. 22, 2004

(51) Int. Cl.[7] .............................................. H03B 3/356
(52) U.S. Cl. .................... 327/208; 327/203; 327/210; 327/525
(58) Field of Search ................... 327/199–203, 327/208, 210–215, 217–219, 225, 525; 365/189.05, 225.7

(56) References Cited

U.S. PATENT DOCUMENTS

| | | | |
|---|---|---|---|
| 5,345,110 A | * | 9/1994 | Renfro et al. ............... 327/199 |
| 5,706,238 A | | 1/1998 | Cutter et al. ............. 365/225.7 |
| 5,789,970 A | | 8/1998 | Denham ...................... 327/525 |
| 6,121,820 A | | 9/2000 | Shishikura .................. 327/525 |
| 6,150,868 A | | 11/2000 | Kim et al. ................... 327/525 |
| 6,191,629 B1 | * | 2/2001 | Bisanti et al. .............. 327/202 |
| 6,201,750 B1 | | 3/2001 | Busch et al. ............. 365/225.7 |
| 6,204,708 B1 | * | 3/2001 | Alexander .................... 327/203 |
| 6,281,739 B1 | * | 8/2001 | Matsui ....................... 327/525 |
| 6,373,771 B1 | | 4/2002 | Fifield et al. ............. 365/225.7 |
| 6,434,077 B1 | | 8/2002 | Holmes .................. 365/225.7 |
| 6,566,937 B1 | * | 5/2003 | Mori et al. .................. 327/525 |
| 2001/0052633 A1 | | 12/2001 | Oikawa |

FOREIGN PATENT DOCUMENTS

JP  2001297596 A  * 10/2001
WO  WO 02/33707 A2  4/2002

* cited by examiner

*Primary Examiner*—Long Nguyen
(74) *Attorney, Agent, or Firm*—Slater & Matsil, L.L.P.

(57) ABSTRACT

A multiple trip point fuse latch device and method is disclosed. Multiple read inputs to a fuse latch enable the altering of the resistive trip point of the fuse latch. A multiple trip point fuse latch may be combined with a slave latch to form a master-slave flip-flop, and multiple master-slave flip-flops may be connected in series to form a shift register. Changing the trip point permits the use of a test procedure that may analyze the margins of a fuse latch during the fuse read operation.

17 Claims, 5 Drawing Sheets

MULTIPLE TRIP POINT FUSE LATCH DEVICE AND METHOD

TECHNICAL FIELD

Aspects of the present invention relate generally to a fuse latch device and method, and more particularly to a multiple trip point fuse latch device and method.

BACKGROUND

Semiconductor integrated circuits, such as processors, microcontrollers, memories, etc., incorporate fuse elements that allow individual configuration of each chip. Examples of parameters capable of being adjusted on a per chip basis are internal timings, supply voltage level, chip identification number, repair information, and the like. In particular, the latter may be used in memory circuits (e.g., DRAMs) to control the manner in which spare elements are used to replace defective elements. With the ever-growing memory capacity of these chips, the number of fuses has also increased. For example, a typical 64 MB DRAM circuit may contain a few thousand fuse elements.

Commonly, a fuse is evaluated by a fuse latch circuit, which translates the analog resistance value of the fuse link into a digital value ("high" or "low"). In addition, the fuse latch stores that digital value. In a typical implementation of a fuse latch, the storing functionality is implemented by using a pair of cross-coupled inverters. The input signal of the first inverter is connected to a precharge switch, which is controlled by a precharge signal, and to a read switch, which is controlled by a read signal. The read switch connects the fuse latch input to one terminal of the fuse element, and the other terminal of the fuse element is connected to the ground power supply. The output of the first inverter provides the fuse latch output, and is also connected to the input of the second inverter. The second inverter output is connected back to the input of the first inverter, thus providing a latch function.

Generally, a fuse evaluation procedure consists of two steps, a precharge operation and a read operation. The precharge operation initializes the fuse latch by precharging the input of the fuse latch prior to the reading of the actual fuse value. Then the read operation turns on the read switch to connect the fuse latch to the fuse terminal. A low fuse resistance will cause the fuse latch to switch its state, whereas a high fuse resistance will not cause a change of state. In effect, the fuse element, the read switch, and the second inverter are resistive elements that form a resistive divider network between the power supply and ground. The latch circuit responds to the voltage at its input, which is a function of the resistance of the resistive elements in the voltage divider.

At the end of a fuse evaluation procedure, the output of the fuse latch is indicative of the state of the fuse. Generally, for example with laser or electrical fuses, a low resistance indicates an unblown fuse, whereas a high resistance indicates a blown fuse. Fuse blowing is typically performed by applying energy (e.g., laser beam, electrical current) to the fuse link. As a result, the fuse link is intentionally damaged and exhibits a higher resistance compared to its resistance before the fuse blow. Commonly, the characteristics of the latch are summarized by a single value, the trip point of the latch. If the fuse resistance is below the latch trip point, the latch output will be high to indicate an unblown fuse. On the other hand, if the fuse resistance is above the latch trip point, the latch output will be low to indicate a blown fuse.

Ideally, the fuse latch trip point is above the unblown fuse resistance and below the blown fuse resistance. These three resistance values (fuse latch trip point, unblown fuse resistance, and blown fuse resistance) are not constant, but are affected by variations in other parameters. These parameters may include, for example, the operating temperature, the manufacturing process of the fuse latch, and the power supply voltage. For reliable operation of the fuse latch, it is desirable that the three resistance values do not overlap and that a sufficient margin between the values exists. Otherwise, if an overlapping situation is present, a blown fuse might be incorrectly indicated as unblown by the fuse latch, or an unblown fuse might be incorrectly indicated as blown by the fuse latch.

In the prior art, however, generally the only accessible value in a fuse latch is the fuse latch output signal. This signal is a digital value that is either in a high or a low state, and therefore does not provide information on the margin between the resistance of an unblown fuse and the trip point, nor does it provide information on the margin between the trip point and the resistance of a blown fuse. Therefore, a prior art fuse latch circuit generally cannot be properly tested for reliability of operation.

SUMMARY OF THE INVENTION

These and other problems are generally solved or circumvented, and technical advantages are generally achieved, by preferred embodiments of the present invention that comprise multiple trip points for a fuse latch. This may be accomplished, for example, by providing multiple read inputs to a fuse latch that enable the altering of the resistive trip point of the fuse latch. Changing the trip point permits the use of a test procedure that may analyze the margins of a fuse latch during the fuse read operation. The results of the test procedure then may be used to identify whether fuse latches on a semiconductor device possess sufficient reliability. If not, the semiconductor device may be redesigned, replaced, repaired or discarded, for example. Preferred embodiments of the present invention may include flip-flops comprising fuse latches connected in series to form shift registers. Such a configuration may be used to efficiently read out fuse values for integrated circuit analysis.

In accordance with a preferred embodiment of the present invention, an integrated circuit comprises a fuse link having a first terminal, a first read switch having a first terminal coupled to the first terminal of the fuse link, and a second terminal coupled to a data in node, a first read input control coupled to a control input of the first read switch, a second read switch having a first terminal coupled to the first terminal of the fuse link and a second terminal coupled to the data in node, a second read input control coupled to a control input of the second read switch, and a latch circuit having an input terminal coupled to the data in node, and having a data out terminal.

In accordance with another preferred embodiment of the present invention, an integrated circuit comprises a fuse link having a first terminal, a first read switch having a first terminal coupled to the first terminal of the fuse link, a second terminal coupled to a data in node, and a control input coupled to a first read input control, a second switch having a first terminal coupled to the data in node, a second terminal coupled to a power supply voltage line, and a control input coupled to a second input control, a third switch having a first terminal coupled to the data in node, a second terminal coupled to the power supply voltage line, and a control input coupled to a third input control, and a latch circuit having an input terminal coupled to the data in node, and having a data out terminal.

In accordance with another preferred embodiment of the present invention, a multiple trip point fuse latch may be combined with a slave latch to form a master-slave flip-flop, and multiple master-slave flip-flops may be connected in series to form a shift register.

In accordance with another preferred embodiment of the present invention, a method of testing fuse latches on an integrated circuit comprises presetting the fuse latches, activating a first fuse read signal to store a first set of fuse values in the fuse latches based on a first fuse latch trip point, reading the first set of fuse values stored in the fuse latches, presetting the fuse latches, activating a second fuse read signal to store a second set of fuse values in the fuse latches based on a second fuse latch trip point, reading the second set of fuse values stored in the fuse latches, and comparing the first set of fuse values to the second set of fuse values.

An advantage of a preferred embodiment of the present invention is that a fuse latch may be provided with multiple fuse latch trip points.

Another advantage of a preferred embodiment of the present invention is that multiple fuse latch trip points may provide reliability regarding the operating margins of a fuse latch.

Another advantage of a preferred embodiment of the present invention is that a reliability analysis of analog fuse resistance may be implemented in a digital manner by comparing binary data values during different precharge-read-shift cycles.

Yet another advantage of a preferred embodiment of the present invention is that the reliability of thousands of fuse latches may be evaluated by accessing a very small number of input and output signals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which like reference symbols generally indicate like elements, wherein.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely integrated circuit fuse evaluation. The invention may also be applied, however, to other integrated circuit applications, as well as to discrete circuit applications, or combinations thereof. In addition, while preferred embodiments for reading out fuse information are described with respect to shift registers comprising series-connected flip-flops, those of ordinary skill in the art will recognize that other circuit configurations may be used to read out fuse information for evaluation.

For ease of reference, the following reference symbol nomenclature is used generally in the drawings to indicate the respective drawing elements:

-01 Input signal controlling the precharge operations of the fuse latch

-02 First input signal controlling the read operation of the fuse latch

-03 Output signal of the fuse latch indicating the state of the fuse

-04 Circuit node connecting circuit elements -22, -23, -24, -25, -26, -27

-05 Node connecting fuse element -30 and NFET -27

-06 Second input signal controlling the read operation of the fuse latch

-07 Node connecting the output of element -41 to the control of element -20

-08 Third input signal controlling the read operation of the fuse latch

-09 Input signal connected to node -04

-11 Power supply voltage

-12 Ground supply voltage

-20 PFET for altering the trip point of the fuse latch

-21 NFET for altering the trip point of the fuse latch

-22 PFET of the second inverter of the fuse latch

-23 NFET of the second inverter of the fuse latch

-24 PFET of the first inverter of the fuse latch

-25 NFET of the first inverter of the fuse latch

-26 PFET precharge switch

-27 NFET read switch

-29 NFET for altering the trip point of the fuse latch

Figure 1A:
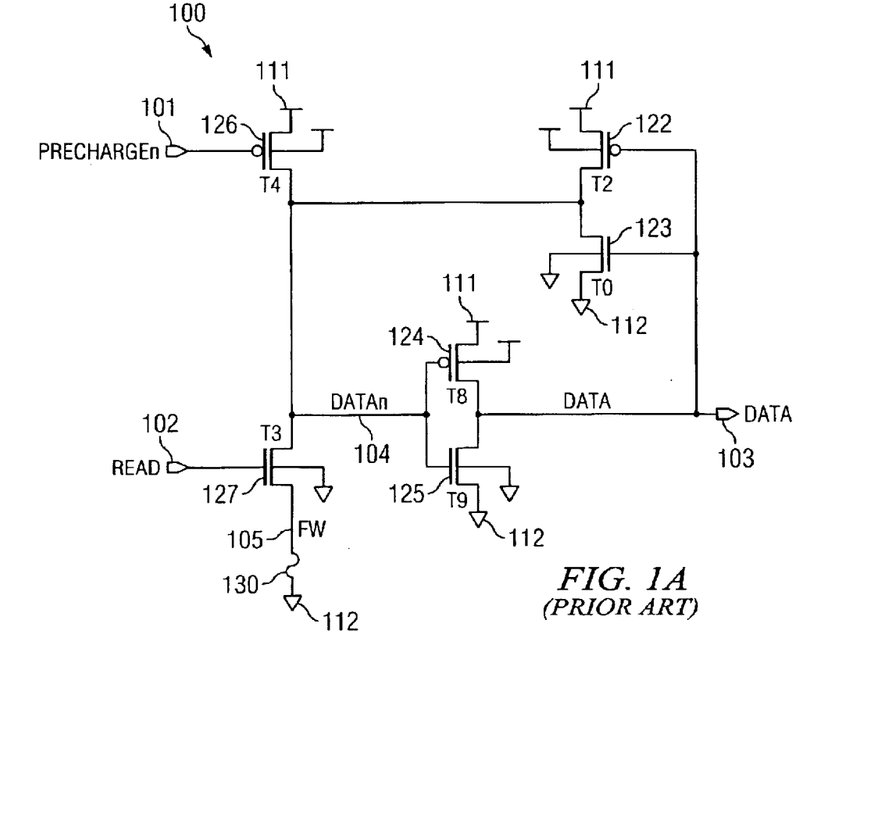
FIG. 1A is a schematic block diagram of a prior art fuse latch.

-30 Fuse element
-41 Inverter element
-42 Two-input NAND element
-51 Data output of a master-slave D-type flip-flop
-52 Data input of a master-slave D-type flip-flop
-53 Inverted clock signal
-54 Clock signal
-62 PFET of a first transmission gate
-63 NFET of a first transmission gate
-64 PFET of a second transmission gate
-65 NFET of a second transmission gate
-66 PFET of the second inverter of a general latch circuit
-67 NFET of the second inverter of a general latch circuit
-68 PFET of the first inverter of a general latch circuit
-69 NFET of the first inverter of a general latch circuit
-71 Data output of a shift register
-72 Data input of a shift register
-81 Node connecting second transmission gate to general latch circuit
-90 General latch circuit With reference now to FIG. 1, there is shown a typical prior art implementation of a fuse latch 100. The storing functionality of the fuse latch 100 is accomplished by using a pair of cross coupled inverters, a first inverter being formed with PFET 124 and NFET 125, and a second inverter being formed with PFET 122 and NFET 123.

Input node 104 of the first inverter is connected to a precharge switch, here implemented as PFET 126. When precharge signal 101 is set low, PFET 126 is put in the conducting state or turned on to connect input 104 to positive power supply 111. Thus, input 104 is forced into the high state. In response, output signal 103 assumes a low state. Because output signal 103 is used as the input of the second inverter, the output of the second inverter goes high and thereby keeps node 104 high even if PFET 126 is switched into the nonconducting state or turned off by bringing precharge signal 101 high again. Node 104 is also connected to a read switch, here implemented as NFET 127, which is controlled by read signal 102. NFET 127 is also connected to one terminal of fuse element 130. The other terminal of the fuse element 130 is connected to ground power supply 112.

A fuse evaluation procedure generally consists of two steps, namely a precharge operation and a read operation. During the precharge operation, precharge signal 101 is brought low to turn on PFET 126 in order to force node 104 into the high state and to store (latch) this high state. The precharge operation initializes the fuse latch ahead of the actual fuse evaluation. After the latch is precharged, precharge signal 101 is brought high again.

The second step, fuse evaluation, is started by bringing read signal 102 high to turn on NFET 127. PFET 122 of the second inverter sinks a current through NFET 127, node 105, and fuse 130. If the fuse resistance is low, the voltage of internal node 104 will drop and cause the latch to flip from the high state into the low state at node 104. In the case of a high fuse resistance, however, the voltage drop at node 104 will be small, and the latch will not switch its state. In other words, PFET 122, NFET 127, NFET 123 and fuse element 130 may be viewed as resistive elements that form a resistive divider network between the two power supply voltages 111 and 112. The latch circuit responds to the voltage at node 104, which is a function of the resistance of the four resistive elements in the voltage divider.

At the end of a fuse evaluation procedure, output signal 103 of the fuse latch is indicative of the state of the fuse. If the fuse resistance is low, signal 103 will be high. If the fuse resistance is high, signal 103 will be low. In the case of laser fuses or electrical fuses, a low resistance indicates an unblown fuse, whereas a high resistance indicates a blown fuse. The fuse blowing itself is typically performed by applying energy (e.g., laser beam, electrical current) to the fuse link. As a result, the fuse link is intentionally damaged and exhibits a higher resistance compared to its resistance before the fuse blow.

Commonly, the characteristics of the latch are summarized by a single value, the trip point of the latch. This value indicates the resistance of fuse element 130, which separates a blown fuse from an unblown fuse, as indicated by output signal 103. If the fuse resistance is below the trip point, an unblown fuse will be indicated by signal 103 being high. On the other hand, if the fuse resistance is above the trip point, a blown fuse will be indicated by signal 103 being low.

Figure 1B:
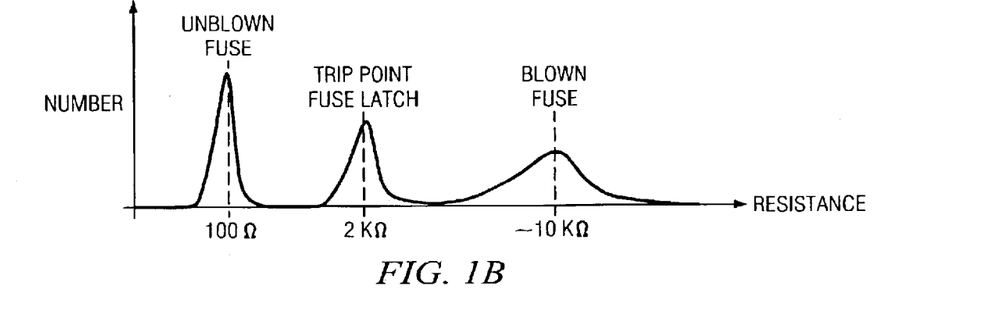
FIG. 1B is a graph of the resistance distribution of an unblown fuse, a blown fuse, and the fuse latch trip point.

As previously discussed, the three above-mentioned resistance values (fuse latch trip point, unblown fuse resistance, and blown fuse resistance) are not constant, but are influenced by variations of other parameters. These parameters may include, for example, the operating temperature, the manufacturing process of the fuse latch, and the power supply voltage. As a result, the resistance values may be described as distributions over a resistance interval, as shown graphically in FIG. 1B. For reliable operation of the fuse latch, it is desirable that the three distributions not overlap and that a sufficient margin exists between the distributions. Otherwise, if an overlapping situation is present, a blown fuse might be incorrectly indicated as unblown by the fuse latch, and vice versa.

Moreover, the only accessible value in the fuse latch of FIG. 1 is the fuse latch output signal 103. This signal is either in a digital high or a low state and therefore does not provide information on the margin between the unblown fuse resistance and the trip point. Similarly, it does not provide information on the margin between the trip point and the resistance of a blown fuse. Therefore, the fuse latch circuit in FIG. 1 generally cannot be tested appropriately for reliable operation.

Figure 2:
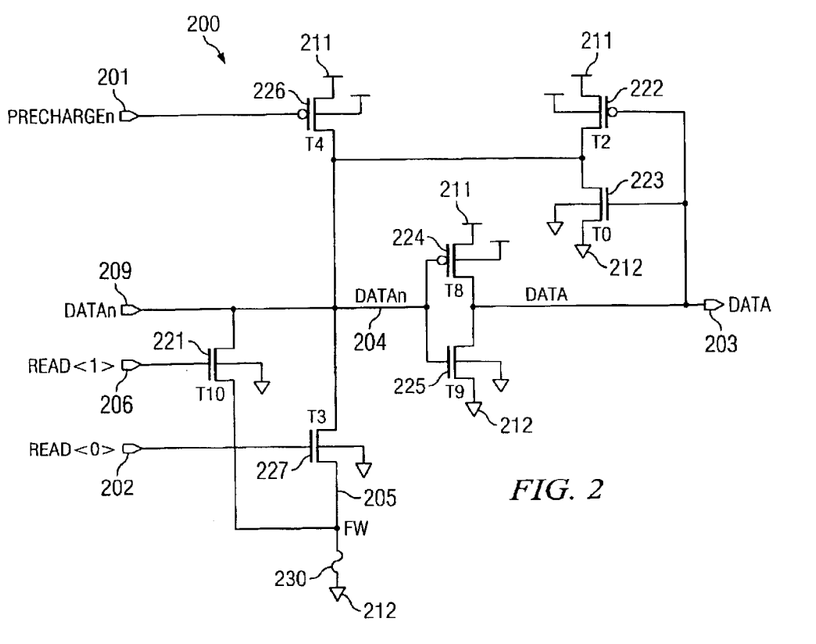
FIG. 2 is a schematic block diagram of a fuse latch with up to three different latch trip points according to one embodiment of the present invention.

With reference now to FIG. 2, there is shown a first embodiment of the present invention, which overcomes deficiencies of prior art fuse latch 100. In addition to comprising elements from fuse latch 100 of FIG. 1, fuse latch 200 comprises a second read switch, here implemented as NFET 221. This read switch is located in parallel to the first read switch (here implemented as NFET 227). NFET 221 is in the conducting state if input read signal 206 assumes a high state.

Accordingly, by having two read switches in parallel, three switch configurations can provide three different current paths for the read operation of the fuse latch. Specifically, input signal 206 may be high and input signal 202 may be low, input signal 206 may be low and input signal 202 may be high, and finally both input signals 206 and 202 may be high. If the resistances of the NFETs 221 and 227 are not identical in the conducting state, each of the three configurations exhibits a different resistance between node 204 and node 205. Consequently, fuse latch 200 has three different trip points, one trip point value for each configuration of input signals 206 and 202. The highest trip point of the fuse latch is observed when both switches are conducting.

A test procedure may be implemented to change the trip point of the fuse latch by changing input signals 206 and 202 while tracking the reaction of output signal 203 to the read operation. Thereby, output signal 203 beneficially becomes indicative of the margins of a fuse latch during the fuse read operation. A further example is provided by FIG. 8, discussed hereinbelow. Also, note that a data input signal 209 may be connected to circuit node 204, if desired for a particular application.

Figure 3:
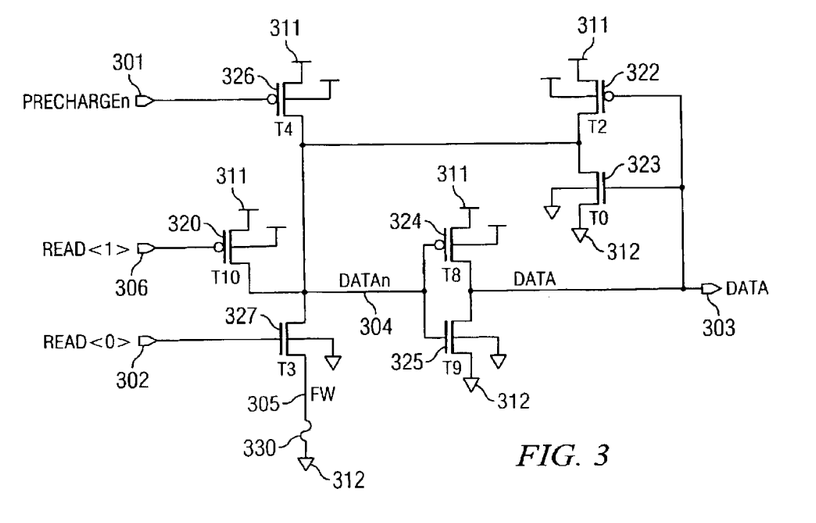
FIG. 3 is a schematic block diagram of a fuse latch with two latch trip points.

FIG. 3 shows a second embodiment of the present invention. In this embodiment, an additional read switch is provided, here implemented as PFET 320. This read switch connects node 304 to positive power supply 311 during a read operation. Read switch 320 is controlled by read signal 306. In this embodiment, two different configurations provide different current paths for a read operation. When read signal 306 is set high, PFET 320 is not conducting, and the fuse latch operates similar to the prior art fuse latch of FIG. 1. If PFET 320 is turned on by bringing read signal 306 low during the read operation, however, two PFETs in parallel, namely 322 and 320, provide a current path from node 304 to positive power supply 311. Therefore, the trip point of the fuse latch will be lower, because the resistance of the fuse has to be lower to trip the latch from a high to a low state on node 304. Again, with the ability to change the trip point of the fuse latch by switching the read signal 306, a test procedure may be realized which observes the margins of the fuse latch by manipulating read input 306 and monitoring output 303.

Figure 4:
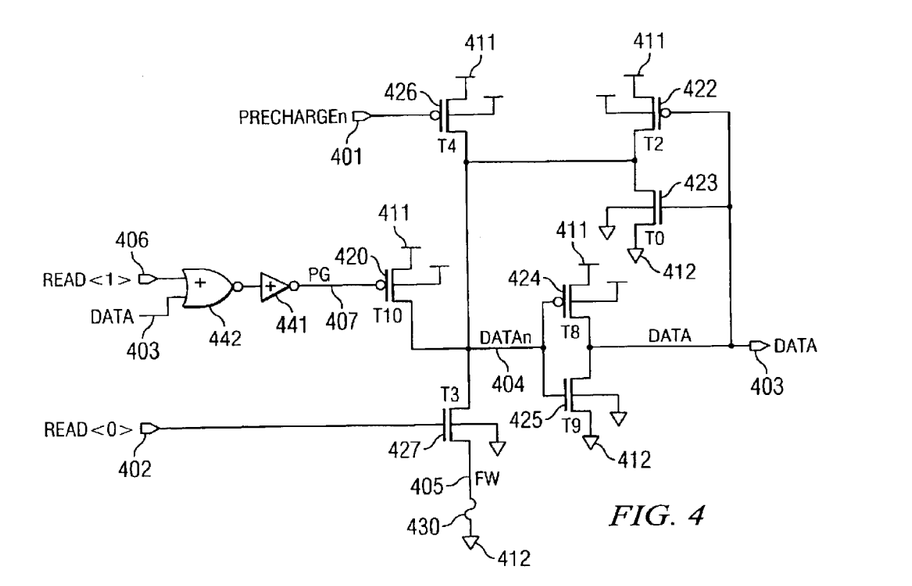
FIG. 4 is a schematic block diagram of a fuse latch with two different trip points, and reduced power consumption compared to the fuse latch of FIG. 3.

FIG. 4 illustrates an alternative embodiment to the fuse latch of FIG. 3, wherein the circuit of FIG. 4 consumes less power during a read operation than the circuit of FIG. 3. With respect to the circuit of FIG. 4, when a fuse exhibits a resistance that is below the trip point of the fuse latch, the fuse latch will trip and node 404 will go low. PFET 422 will be turned off because node 403 goes high. In addition, gate input signal 407 of PFET 420 will go high, because a high value on signal 403 will force the output of inverter 441 high. The input of inverter 441 is driven by two input nor gate 442. One input of nor gate 442 is connected to read control signal 406, and the other input to fuse output 403. Consequently, as soon as data output signal 403 assumes a high state, both PFETs 420 and 422 will be turned off and terminate the current flow through NFET 427 and fuse element 430. This is in contrast to the circuit of FIG. 3, wherein PFET 320 will be on and allow current flow as long as read control signal 306 is high.

Therefore the fuse latch of FIG. 3 will consume more current during the reading of a fuse with a low resistance than will the fuse latch of FIG. 4. For a typical configuration, the circuit of FIG. 3 would consume approximately 50 $\mu A$, whereas the circuit of FIG. 4 would just consume 20 nA after the fuse latch has changed its state. This difference in power consumption becomes significant if a large number of fuses are used on a chip. For example, in a 64 MB DRAM chip with approximately 5000 fuse latches, the current used during the read operation would be reduced from about 200 mA to about 80 $\mu A$, assuming that 80% of the fuses are unblown.

Figure 5:
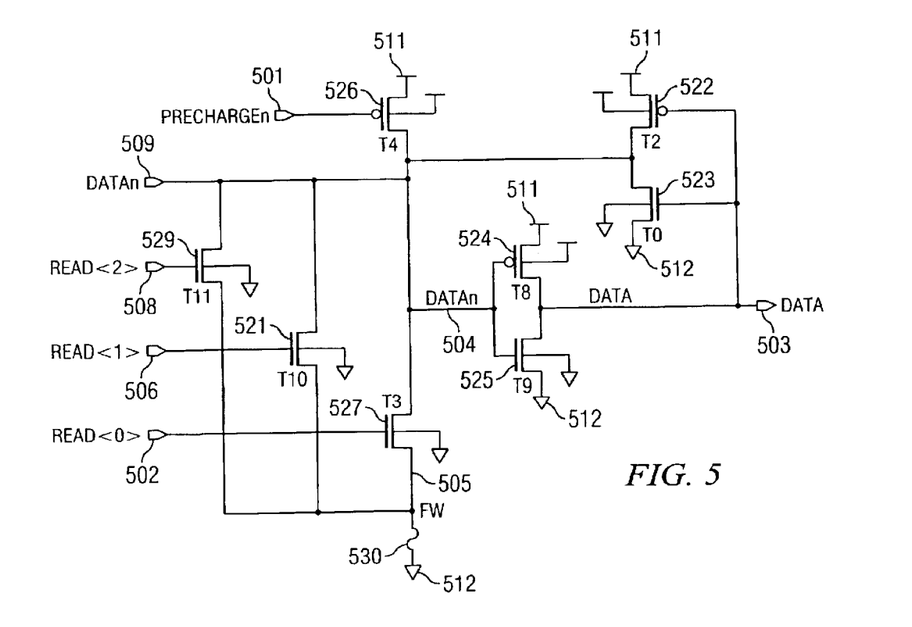
FIG. 5 is a schematic block diagram of a fuse latch with up to seven different latch trip points.

FIG. 5 illustrates an alternate embodiment to the circuit of FIG. 2, wherein the number of trip points for a fuse latch is increased by implementing additional read switches. In this embodiment, another read switch, NFET 529, is connected in parallel to read switches NFET 521 and NFET 527 already present in the fuse latch of FIG. 2. With proper sizing of the three NFETs, the fuse latch may have up to seven different trip points, corresponding to (1) signal 502 on, (2) signal 506 on, (3) signal 508 on, (4) signals 502 and 506 on, (5) signals 502 and 508 on, (6) signals 506 and 508 on, and (7) signals 502, 506 and 508 on. By adding more read switches, more trip points may be implemented.

This method may be applied to the fuse latches of FIG. 3 or FIG. 4 in a similar fashion, by connecting additional PFET read switches in parallel to the existing PFET read switch 320, or 420, respectively. Furthermore, in accordance with another preferred embodiment of the present invention, a fuse latch may employ a combination of the circuits of FIG. 2 and FIG. 3 by including one or more additional NFET read out switches and one or more additional PFET read out switches. Another preferred embodiment of the present invention is a fuse latch with a fuse element that connects to the positive power supply instead of the ground power supply. Also, data input signal 509 may be connected to circuit node 504, if desired for a particular application.

Figure 6:
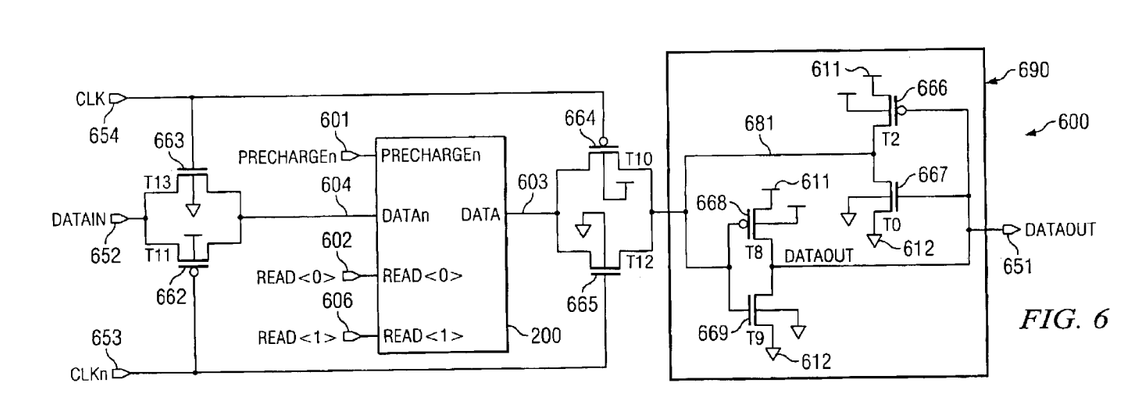
FIG. 6 is a hierarchical schematic block diagram of a master-slave D-type flip-flop implemented with the fuse latch of FIG. 5.

FIG. 6 illustrates a master slave D-type flip-flop 600 based on a multiple trip point fuse latch in accordance with a preferred embodiment of the present invention. The multiple trip point fuse latch of FIG. 2 is used in this embodiment, although any embodiment may be used. The circuit of FIG. 6 includes two transmission gates, each one consisting of a PFET and an NFET. The first transmission gate has PFET 662 and NFET 663. The gate of PFET 662 connects to active low clock signal CLKn 653, while the gate of NFET 663 is connected to active high clock signal CLK 654, with CLKn 653 being the inverted signal of CLK 654. NFET 663 and PFET 662 connect data input 652 of the D-type flip-flop to node 604 of fuse latch 200 if CLK 654 is high and CLKn 653 is low.

A second transmission gate, consisting of NFET 665 and PFET 664, connects the output 603 of fuse latch 200 with node 681 when CLK 654 is low and CLKn 653 is high. Node 681 provides the input to general latch 690, consisting of PFET 666, NFET 667, PFET 668, and NFET 669 connected as a pair of cross-coupled inverters. General latch 690 functions as the slave portion of the master slave D-type flip-flop. Consequently, when CLK 654 is high and CLKn 653 is low, a data bit is transferred from data input 652 into fuse latch 200. Similarly, when CLK 654 is low and CLKn 653 is high, a data bit is transferred from fuse latch 200 output 603 into general latch 690, which is available at data out 651.

Figure 7:
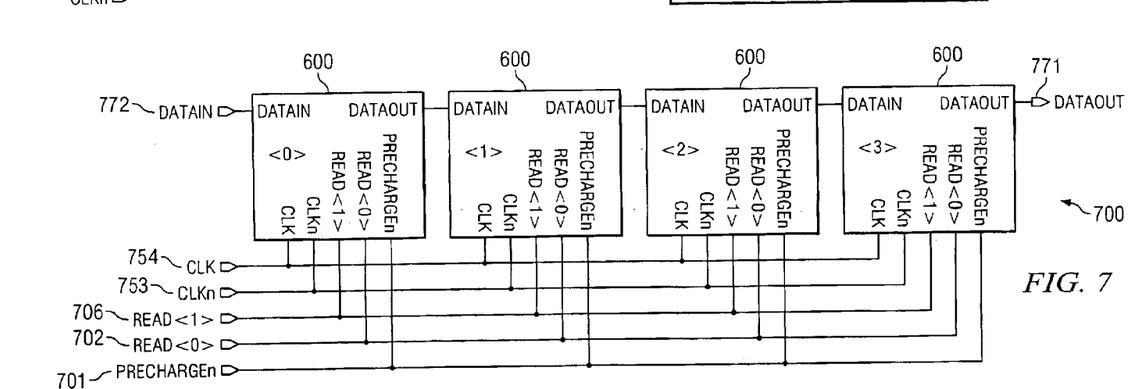
FIG. 7 is a hierarchical schematic block diagram of a shift register implemented with the flip-flop of FIG. 6.

FIG. 7 illustrates a shift register 700 based on master slave D-type flip-flop 600 in accordance with a preferred embodiment of the present invention. Master slave D-type flip-flop 600 contains a multiple trip point fuse latch as previously described with respect to FIG. 6. Multiple master slave D-type flip-flops are connected in series to form shift register 700. In this embodiment, the flip-flops share connections to common signals, such as CLK 754, CLKn 753, precharge control 701, first read switch control 702, and second read switch control 706. The data output signal of one flip-flop is fed into the data input of the succeeding flip-flop, thus forming a shift register chain. The flip-flops at the beginning and end of the chain connect to a shift register data input 772 and shift register data output 771, respectively. While FIG. 7 shows four flip-flops 600 being connected as shift register 700, any number of flip-flops 600 may be used to construct a shift register.

The shift register 700 may be operated as follows. A low pulse on precharge control signal 701 presets all fuse latches 200 inside flip-flops 600 simultaneously. High pulses on one or both of the two read control signals 702 and 706 activate a fuse read operation inside each of the fuse latches 200. Toggling the clock signals CLK 754 and CLKn 753 shifts the read state values of the fuses through the flip-flops toward shift register data output 771.

Figure 8:
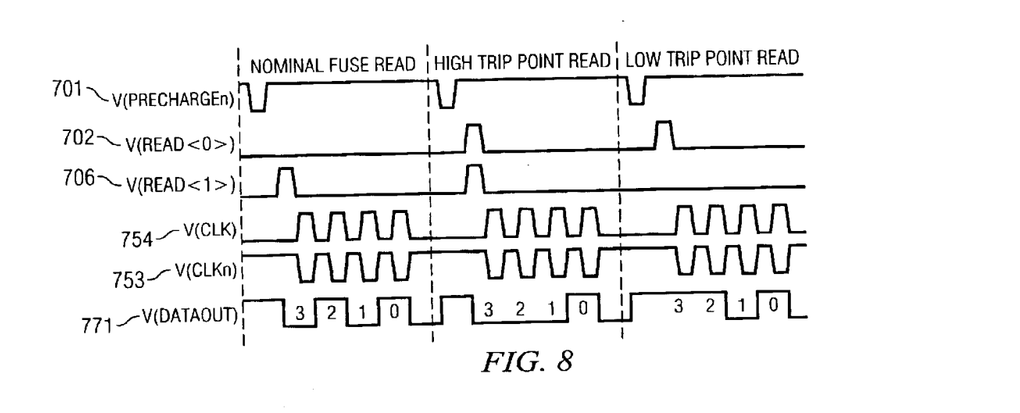
FIG. 8 is a timing diagram of the operation of the circuit of FIG. 7.

FIG. 8 is a timing diagram illustrating the operation of shift register 700. FIG. 8 depicts three precharge-read-shift cycles, each cycle using a different trip point configuration for the fuse read operation. Each cycle is started by a precharge operation as indicated by precharge signal 701 having a low pulse. Next, the fuses are read by executing a high pulse on one or both of the read control signals 702 and 706. After the read operation, the state of the fuses (blown vs. unblown) is stored as a binary signal (high or low) inside each of the fuse latches 200. This information is then read serially at data output 771 by toggling the clock signals CLK 754 and CLKn 753.

A high signal at data output 771 is indicative of a fuse element which has a fuse resistance above the latch trip point (i.e., a blown fuse), while a low signal at data output 771 is indicative of a fuse element with a resistance below the latch trip point (i.e., an unblown fuse). In the present example, during the first fuse read cycle, read out signal 701 is activated. As shown by data out signal 771, fuses 0 and 2 in flip-flops 600<0> and 600<2>, respectively, are identified as blown, and fuses 1 and 3 in flip-flops 600<1> and 600<3>, respectively, are identified as unblown. This read out result may be considered the fuse read operation with nominal trip point.

During the next cycle, both read out signals 701 and 702 in each flip-flop 600 are activated. As previously discussed, the parallel activation of both switches raises the trip point of the fuse latch. As shown by data out signal 771, the succeeding shift operation reveals that fuse 2 is read as an unblown fuse when the trip point is raised. Combined with the results of the first read cycle, this is indicative of a fuse that is blown but does not have sufficient margin between its resistance value and the nominal trip point of the fuse latch.

During the last cycle, the alternative read out signal 702 is activated. If the associated read out switch has a lower conductivity compared to the read out switch associated with read out signal 701 (e.g., an NFET with smaller channel width), the trip point of the fuse latch will be lower compared to the nominal trip point. In this read out cycle, as shown by data out 771, the shift operation shows fuse 3 as blown. Combined with the results of the first read cycle, this is indicative of a fuse with a resistance that is below the nominal trip point of the fuse latch but does not have sufficient margin between its resistance value and the nominal trip point of the fuse latch.

The preceding example comprised a shift register with just four flip-flops for simplicity of explanation. A typical implementation of such a shift register, however, may comprise any number of flip-flops, and may comprise several thousand flip-flops. As such, the reliability of thousands of fuse latches may be evaluated by accessing a very small number of input and output signals (six signals according to FIG. 8). In addition, even though the fuse resistance is analog in nature, a reliability analysis may be easily implemented by providing a method of comparing the binary data values at the data output signal during the different precharge-read-shift cycles. For the example of FIG. 8, the bit string "0101" for the nominal case is compared to "0001" (high trip point) and "1101" (low trip point). Mismatches in the bit string generally highlight the fuses and fuse latches that do not provide sufficient margin for a reliable fuse read operation.

Figure 9:
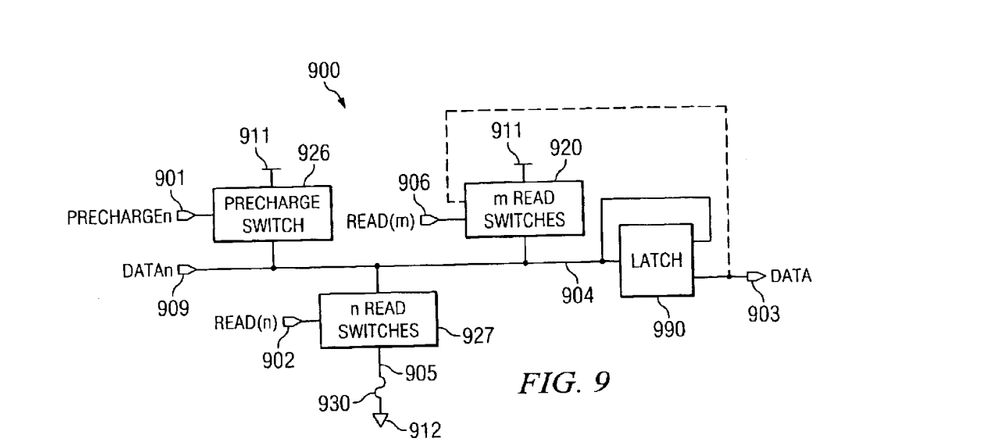
FIG. 9 is a high level block diagram of a multiple trip point fuse latch.

With reference now to FIG. 9, there is shown a high level block diagram of fuse latch 900, in accordance with a preferred embodiment of the present invention. In FIG. 9, read switch 927 represents n read switches and read(n) signal 902 represents n read signals, where n is 1, 2, 3, etc.

Likewise, read switch 920 represents m read switches and read(m) signal 906 represents m read signals, where m is 0, 1, 2, etc. The total number of read switches (n+m) generally must be greater than or equal to 2. The total number of different latch trip points for the circuit of FIG. 9 may be represented generally by the formula $(2^n-1)*(2^m)$, where n is the number of read switches 927 connected in parallel between node 904 and fuse 930, and m is the number of read switches 920 connected in parallel between power supply voltage 911 and node 904. For example, if there are two read switches 927 and one read switch 920, then there are $(2^2-1)*(2^1)=6$ possible different latch trip points.

As an alternative embodiment, precharge switch 926, being connected in parallel between power supply voltage 911 and node 904, may be used as one of the m read switches 920 for providing additional trip points during read operations. In this embodiment, m would be 1, 2, 3, etc., and the total number of read switches (n+m) including the precharge switch generally must be greater than or equal to 3. Also, data output 903 is shown optionally being fed back to turn off or disable read switch 920 during a read operation, in a manner similar to that described with respect to FIG. 4.

Although the present invention and its advantages have been described in detail, it should be understood that various changes, substitutions and alterations can be made herein without departing from the spirit and scope of the invention as defined by the appended claims. For example, depending on the specific context, the term latch is used herein sometimes to refer in particular to the latch storage circuit, and at other times to refer in general to the overall fuse latch circuit, including the fuse link and the various switches. As another example, it should be understood that terms such as node, line, connection, terminal, couple, signal, input and output are used in their broadest possible, and often overlapping or interchangeable, sense. As another example, it will be readily understood by those skilled in the art that the circuitry may be implemented in CMOS, NMOS, PMOS, bipolar, or other circuit fabrication types, or combinations thereof. In addition, active high signals may be changed to active low signals, and vice versa. Furthermore, the power supply voltages may be varied depending on the specific application, and any combination of positive, negative or ground voltages may be used. The circuit switches described herein, such as the precharge and read out switches, may be implemented with circuit devices other than FETs. Also, PFETs may be exchanged for NFETs, and vice versa. While the flip flops are described as master slave D-type flip flops, it is readily understood that other types of flip flops may be used.

Throughout the specification, the terms fuse and fuse link are used broadly to include any nonvolatile circuit element capable of having its state changed indefinitely. For example, a fuse link may be formed by an anti-fuse circuit element. In contrast to a fusible link that exhibits higher resistance in the blown state compared to the unblown state, an anti-fuse exhibits a lower resistance in the blown state compared to the unblown state. As a specific example, with reference to FIG. 2, a high state on output signal 203 would be indicative of a blown fuse when using an anti-fuse for the fuse link.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit for providing a multiple trip point latch device for evaluating the state of a fuse link comprising:
the fuse link having a first terminal and a second terminal;
a first FET (field effect transistor) having a first one of its source and drain coupled in the first terminal of the fuse link, and a second on of its source and drain coupled to a data in node;
a first read input control signal coupled to a control input of the FET for switching said first FET to one of an ON state and an OFF state during a selected read time period;
a second FET having its source and drain connected in parallel with said first FET;
a second read input signal coupled to a control input of the second FET for switching said second FET to one of an ON state and an OFF state during the selected read time period;
a latch circuit having an input terminal coupled to the data in node, and having a data out terminal;
a first electrical path extending from said second terminal of said fuse link, through said fuse link and through said FET to said data in node when said first read input control signal switches said first FET to said ON state and second read input control signal switches said second FET to said OFF state, said first electrical path defining a first resistance value and setting a first trip point; and
a second electrical path extending from said terminal of said fuse link, through said fuse link and through both said first and said second FETs connected in parallel said data in node when said first read input control signal switches said first FET to said ON state and said second read input control switches said second FET to said ON state, said second electrical path defining a second resistance value and setting a second trip point.

2. The integrated circuit of claim 1, wherein the latch circuit further comprises a latch feedback signal coupled to the first data in node.

3. The integrated circuit of claim 2, wherein the latch circuit further comprises first and second cross coupled inverters, wherein the first inverter has an input coupled to the data in node and an output coupled to the data out terminal, and wherein the second inverter has an input coupled to the data out terminal and an output coupled to the latch feedback signal.

4. The integrated circuit of claim 3,
wherein the first inverter further comprises
a first PFET having a gate coupled to the data in node, a first terminal of said first PFET coupled to a power supply voltage line, and a second terminal of said first PFET coupled to the output of the first inverter, and
a first NFET having a gate coupled to the data in node, a first terminal of said first NFET coupled to a power supply ground line, and a second terminal of said NFET coupled to the output of the first inverter; and wherein the second inverter further comprises
a second PFET having a gate coupled to the output of the first inverter, a first terminal of said second PFET coupled to a power supply voltage line, and a second terminal of said second PFET coupled to the latch feedback signal, and
a second NFET having a gate coupled to the output of the first inverter, a first terminal of said second NFET coupled to a power supply ground line, and a second terminal of said second NFET coupled to the latch feedback signal.

5. The integrated circuit of claim 1, further comprising:
a third FET having its source and drain connected in parallel with said first and second FETs; and
a third read input control coupled to a control input of the third FET for switching said third FET between an ON state and an OFF state, said third FET cooperating with said first and second FETs to provide additional ones of said multiple trip points.

6. The integrated circuit of claim 1, further comprising:
a precharge switch having a first terminal coupled to the data in node, and having a second terminal coupled to a power supply voltage line; and
a precharge input control coupled to a control input of the precharge switch.

7. The integrated circuit of claim 1, wherein said fuse link is a fusible link.

8. The integrated circuit of claim 1, wherein said fuse link is an anti-fuse.

9. The integrated circuit of claim 1, wherein said latch device comprises a first latch and said integrated circuit further comprising:
a first slave latch having an input coupled to the data out terminal.

10. The integrated circuit of claim 9, further comprising:
a first transmission gate having an input, and having an output coupled to the data in node;
a second transmission gate disposed between the latch circuit data out terminal and the first slave latch input.

11. The integrated circuit of claim 9, wherein said first master latch and said first slave latch together comprise master-slave flip-flop and said integrated circuit further comprising a second master slave flip-flop connected in series with the first master and slave latches to from a shift register.

12. The integrated circuit of claim 1 further comprising a third electrical path extending from said second terminal of said fuse link, through said fuse link and through said second FET to said data mode where said first read input control signal switches said first FET to said OFF state and said second read input control signal switches said FET to said ON state, said third electrical path defining a third electrical path defining a third resistance value and setting a third trip point.

13. An integrated circuit comprising:
a fuse link having a first terminal;
a first read switch having a first terminal coupled to the first terminal of the fuse link, and a second terminal coupled to a data in node;
a first read input coupled to a control input of the read switch;
a second read switch having a first terminal coupled to the first terminal of the fuse link and a second terminal coupled to the data in node;

a second read input control coupled to a control input of the second read switch;

a latch circuit having an input terminal coupled to the data in node, and having a data out terminal;

a precharge switch having a first terminal coupled to the data in node and having a second terminal coupled to a power supply voltage line;

a precharge input control coupled to a control input of the precharge switch;

a third read switch having a first terminal coupled to the data in node, and having a second terminal coupled to the power supply voltage line; and a third read input control coupled to a control input of the third read switch.

14. The integrated circuit of claim 13, wherein the latch circuit further comprises a latch feedback signal coupled to the data in node.

15. The integrated circuit of claim 13, wherein the latch circuit further comprises first and second cross coupled inverters, wherein the first inverter has an input coupled to the data in node and an output coupled to the data out terminal, and wherein the second inverter has an input coupled to the data out terminal and an output coupled to the latch feedback signal.

16. The integrated circuit of claim 13, wherein said fuse link is a fusible link.

17. The integrated circuit of claim 13, wherein said fuse link is an anti-fuse.

* * * * *

UNITED STATES PATENT AND TRADEMARK OFFICE
CERTIFICATE OF CORRECTION

PATENT NO. : 6,882,202 B2
DATED : April 19, 2005
INVENTOR(S) : Lehmann et al.

It is certified that error appears in the above-identified patent and that said Letters Patent is hereby corrected as shown below:

Column 11,
Line 15, delete "in" and insert -- to --.
Line 16, delete "on" and insert -- one --.
Line 18, insert -- first -- between "the" and "FET".
Line 49, delete "first".

Signed and Sealed this

Twenty-eighth Day of June, 2005

JON W. DUDAS
*Director of the United States Patent and Trademark Office*